US008362852B2

(12) United States Patent
Tanaka

(10) Patent No.: US 8,362,852 B2
(45) Date of Patent: Jan. 29, 2013

(54) BRANCHING FILTER

(75) Inventor: Nobuhira Tanaka, Yasu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 472 days.

(21) Appl. No.: 12/606,302

(22) Filed: Oct. 27, 2009

(65) Prior Publication Data

US 2010/0109802 A1    May 6, 2010

(30) Foreign Application Priority Data

Oct. 30, 2008   (JP) .................. 2008-279719

(51) Int. Cl.
*H03H 9/72* (2006.01)
*H03H 9/64* (2006.01)
(52) U.S. Cl. .................. 333/133; 333/193; 333/195
(58) Field of Classification Search .................. 333/133, 333/193–196, 189
See application file for complete search history.

(56) References Cited

U.S. PATENT DOCUMENTS

| | | | |
|---|---|---|---|
| 5,966,060 A | | 10/1999 | Ikada |
| 6,057,744 A | * | 5/2000 | Ikada ............................ 333/133 |
| 7,154,359 B2 | * | 12/2006 | Inoue et al. .................... 333/193 |
| 7,518,470 B2 | * | 4/2009 | Makibuchi et al. ........... 333/193 |
| 7,554,419 B2 | * | 6/2009 | Inoue et al. ..................... 333/26 |
| 2004/0119561 A1 | | 6/2004 | Omote |
| 2004/0155730 A1 | | 8/2004 | Iwamoto et al. |
| 2005/0242903 A1 | | 11/2005 | Inoue et al. |
| 2008/0284540 A1 | | 11/2008 | Nishihara et al. |
| 2009/0058555 A1 | | 3/2009 | Takata et al. |

FOREIGN PATENT DOCUMENTS

| | | |
|---|---|---|
| JP | 10-93381 A | 4/1998 |
| JP | 2003-249842 A | 9/2003 |
| JP | 2004-173245 A | 6/2004 |
| JP | 2005-318307 A | 11/2005 |
| JP | 2007-181195 A | 7/2007 |
| JP | 2008-271230 A | 11/2008 |
| WO | 2007/145049 A1 | 12/2007 |

OTHER PUBLICATIONS

Official Communication issued in corresponding Japanese Patent Application No. 2008-279719, mailed on Aug. 24, 2010.

* cited by examiner

*Primary Examiner* — Barbara Summons
(74) *Attorney, Agent, or Firm* — Keating & Bennett, LLP

(57) ABSTRACT

A branching filter includes an antenna terminal, a transmission signal terminal, a reception signal terminal, a transmission filter element, and a reception filter element. At least one of the transmission filter element and the reception filter element includes a longitudinally coupled resonator filter element having first and second IDT electrodes arranged along a direction of propagation of an elastic wave. The first IDT electrode includes a first end connected to the antenna terminal. The second IDT electrode includes a first end connected to one of the transmission signal terminal and the reception signal terminal. The longitudinally coupled resonator filter element further includes an inductor connected in series between a second end of the first IDT electrode and a ground potential.

2 Claims, 8 Drawing Sheets

BRANCHING FILTER

BACKGROUND OF THE INVENTION

1. Field of the Invention

The present invention relates to branching filters and, in particular, to a branching filter including a transmission filter element and a reception filter element that are connected to an antenna terminal.

2. Description of the Related Art

The demand for miniaturization in portable communication terminals is increasing, so it is highly desired to reduce the size of a branching filter for use in a portable communication terminal.

As small branching filters, branching filters including surface acoustic wave (SAW) resonators are widely used. For example, Japanese Unexamined Patent Application Publication No. 2003-249842, which corresponds to U.S. Patent Application Publication No. 2004/0155730, discloses a branching filter that includes a ladder filter element having a plurality of SAW resonators as a transmission filter element and a longitudinally coupled resonator filter element as a reception filter element.

A branching filter must have a transmission filter element having a transmission characteristic (Tx characteristic) of the transmission filter element in which attenuation is large in many frequency bands, including an Rx band, a GPS band, a wireless local area network (WLAN) band, a second-harmonic wave band, and a third-harmonic wave band. One approach to providing attenuation poles in many frequency bands is disclosed in Japanese Unexamined Patent Application Publication No. 2004-173245, which corresponds to U.S. Patent Application Publication No. 2004/0119561. In this approach, attenuation poles are provided by providing an inductor, together with a parallel arm resonator, to a parallel arm in a branching filter using a ladder filter.

Unfortunately, for example, when many attenuation poles are provided by an increased number of parallel arms each having a parallel arm resonator and an inductor, the size of the branching filter is increased. Thus, it is difficult to sufficiently reduce the size of the branching filter.

SUMMARY OF THE INVENTION

To overcome the problems described above, preferred embodiments of the present invention provide a branching filter that includes many attenuation poles and has a small size.

According to a preferred embodiment of the present invention, a branching filter includes an antenna terminal, a transmission signal terminal, a reception signal terminal, a transmission filter element disposed between the antenna terminal and the transmission signal terminal, and a reception filter element disposed between the antenna terminal and the reception signal terminal. At least one of the transmission filter element and the reception filter element includes a longitudinally coupled resonator filter element including first and second IDT electrodes arranged along a direction of propagation of an elastic wave. The first IDT electrode includes a first end connected to the antenna terminal. The second IDT electrode includes a first end connected to one of the transmission signal terminal and the reception signal terminal. The longitudinally coupled resonator filter element further includes an inductor connected in series between a second end of the first IDT electrode and a ground potential.

The reception filter element may preferably include a longitudinally coupled resonator filter element, and the transmission filter element may preferably include a ladder filter element. With this configuration, because the transmission filter element, to which a large electric power is applied, includes the ladder filter having high withstand electric power, the withstand electric power of the branching filter can be increased.

The inductor may preferably be connected to a first ground electrode, and the second IDT electrode may preferably include a second end connected to a second ground electrode separated from the first ground electrode. With this configuration, the insertion loss in an attenuation range caused by the inductor can be further increased. Accordingly, the filter characteristic can be further enhanced.

With the branching filter according to preferred embodiments of the present invention, because, in one of the transmission filter element and the reception filter element, the inductor is connected in series between the second end of the first IDT electrode and the ground potential, an attenuation range can be produced in a region higher than the pass band of the other one of the transmission filter element and the reception filter element. Accordingly, the number of attenuation ranges that a portion of the other one of the transmission filter element and the reception filter element, the portion excluding an inductor, can be reduced. Thus, the size of the transmission filter element or the reception filter element can be reduced, and the branching filter can be miniaturized.

Other features, elements, steps, characteristics and advantages of the present invention will become more apparent from the following detailed description of preferred embodiments of the present invention (with reference to the attached drawings).

DETAILED DESCRIPTION OF PREFERRED EMBODIMENTS

Preferred embodiments of the present invention are described below with reference to the accompanying drawings.

First Preferred Embodiment

Figure 1:
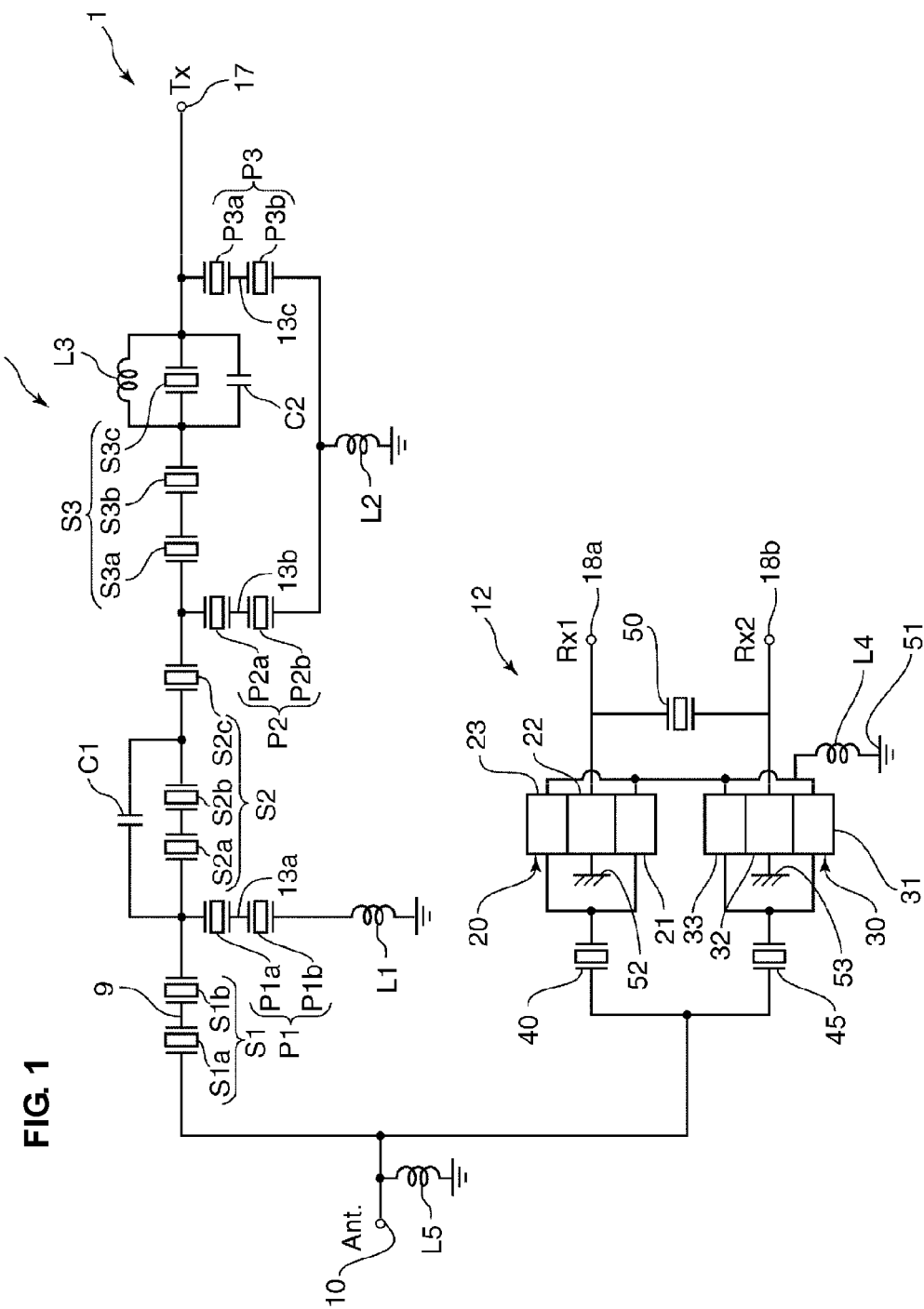
FIG. 1 is a circuit diagram of a branching filter according to a first preferred embodiment of the present invention.

FIG. 1 is a circuit diagram of a branching filter according to a first preferred embodiment of the present invention. As illustrated in FIG. 1, a branching filter 1 according to the present preferred embodiment includes a transmission filter element 11 and a reception filter element 12. The reception filter element 12 is disposed between an antenna terminal 10 and each of a first reception signal terminal 18a and a second reception signal terminal 18b. The transmission filter element 11 is disposed between the antenna terminal 10 and a transmission signal terminal 17. An inductor L5 is connected between a ground potential and a node of the antenna terminal 10, the transmission filter element 11, and the reception filter element 12.

In the present preferred embodiment, an example is described in which each of the transmission filter element 11 and the reception filter element 12 is preferably a filter that utilizes a surface acoustic wave. However, the present invention is not limited to this example. For example, each of the transmission filter element 11 and the reception filter element 12 can also be a filter that utilizes a boundary elastic wave.

The transmission filter element 11 includes a ladder filter element. More specifically, the transmission filter element 11 includes a series arm 9 connecting the antenna terminal 10 and the transmission signal terminal 17.

The series arm 9 includes a plurality of series arm resonators S1 to S3 connected in series. Each of the series arm resonators S1 to S3 includes a single series arm resonator element or a plurality of series arm resonator elements connected in series. That is, the series arm 9 includes a plurality of series arm resonator elements connected in series.

More specifically, in the present preferred embodiment, the first series arm resonator S1 is connected in series to the antenna terminal 10 and includes two series arm resonator elements S1a and S1b connected in series.

The second series arm resonator S2 is disposed downstream of the first series arm resonator S1 and includes three series arm resonators S2a to S2c connected in series. The series arm resonator elements S2a and S2b of the three series arm resonator elements S2a to S2c defining the second series arm resonator S2 are connected in parallel to a capacitor C1.

The third series arm resonator S3 is disposed between the second series arm resonator S2 and the transmission signal terminal 17 and includes three series arm resonator elements S3a to S3c connected in series. The series arm resonator element S3c of the three series arm resonators S3a to S3c defining the third series arm resonator S3 is connected in parallel to a capacitor C2. The series arm resonator element S3c is also connected in parallel to an inductor L3.

Each of the capacitors in the present preferred embodiment may also preferably be a capacitor including a pair of comb electrodes on a piezoelectric substrate, a capacitor including a pair of capacitor electrodes on a piezoelectric substrate, or an external capacitor, for example.

At least one parallel arm is connected between the series arm 9 and a ground potential. More specifically, in the present preferred embodiment, a plurality of parallel arms 13a to 13c is connected between the series arm 9 and a corresponding ground potential.

The plurality of parallel arms 13a, 13b, and 13c are provided with parallel arm resonators P1, P2, and P3, respectively. Each of the parallel arm resonators P1, P2, and P3 includes a single parallel arm resonator element or a plurality of parallel arm resonator elements connected in series.

More specifically, the first parallel arm 13a is connected between a ground potential and a node of the first series arm resonator S1 and the second series arm resonator S2. The first parallel arm 13a is provided with the first parallel arm resonator P1 and an inductor L1. The first parallel arm resonator P1 includes two parallel arm resonator elements P1a and P1b connected in series.

The second parallel arm 13b is connected between a ground potential and a node of the second series arm resonator S2 and the third series arm resonator S3. The second parallel arm 13b is provided with the second parallel arm resonator P2. The second parallel arm resonator P2 includes two parallel arm resonator elements P2a and P2b connected in series.

The third parallel arm 13c is connected between the ground potential and a node of the third series arm resonator S3 and the transmission signal terminal 17. The third parallel arm 13c is provided with the third parallel arm resonator P3. The third parallel arm resonator P3 includes two parallel arm resonator elements P3a and P3b.

The second parallel arm 13b and the third parallel arm 13c are connected to each other and are connected to the ground potential through an inductor L2. Each of the inductor L2 and the inductors L1 and L3 may preferably be defined by an inductance component obtained from a wiring pattern or a coil pattern, for example, and alternatively, they may also be defined by separate inductor chips, for example.

An IDT electrode of each resonator element in the present preferred embodiment may preferably be subjected to weighting, such as weighting on a cross width, for example, and may preferably include a small-pitch electrode-finger portion (hereinafter referred to also simply as a small pitch portion), for example, in which the pitch of electrode fingers is smaller than that in the other portion.

Figure 2:
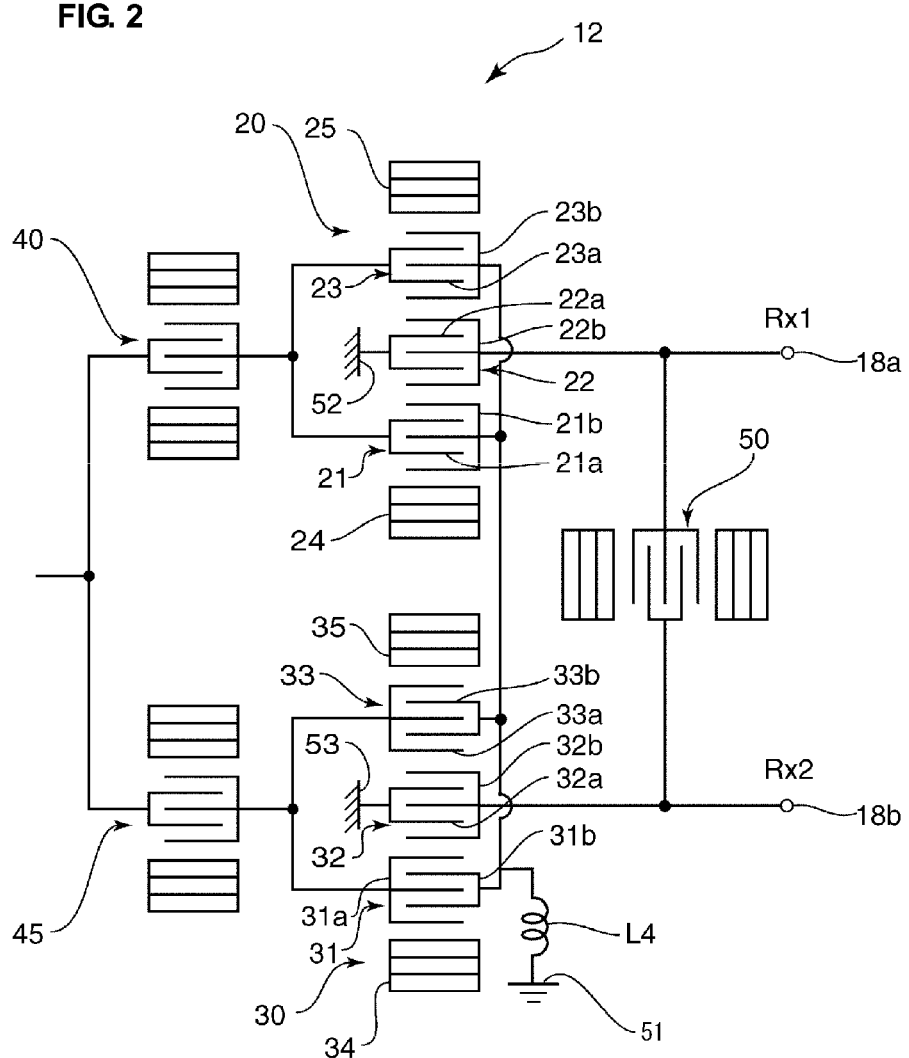
FIG. 2 is a circuit diagram of a reception filter element according to the first preferred embodiment of the present invention.

Next, a configuration of the reception filter element is described with reference to FIG. 2. In FIG. 1, the reception filter element 12 is schematically illustrated such that several components, such as grating reflectors 24, 25, 34, and 35, are omitted. Also in FIG. 2, IDT electrodes and grating reflectors are illustrated in a simplified manner. The number of electrode fingers of each of the IDT electrodes and grating reflectors illustrated is less than the actual number.

In the present preferred embodiment, the reception filter element 12 includes a longitudinally coupled resonator SAW filter element. More specifically, as illustrated in FIG. 2, the reception filter element 12 includes first and second longitudinally coupled resonator SAW filter sections 20 and 30. Each of the first and second longitudinally coupled resonator SAW filter sections 20 and 30 is preferably a 3-IDT type, for example.

As illustrated in FIG. 1, the first longitudinally coupled resonator SAW filter section 20 is disposed between the antenna terminal 10 and the first reception signal terminal 18a. As illustrated in FIG. 2, the first longitudinally coupled resonator SAW filter section 20 includes first to third IDT electrodes 21 to 23 arranged in this order along the direction of propagation of a SAW. The first and second grating reflectors 24 and 25 are arranged at opposite sides of a region in which the first to third IDT electrodes 21 to 23 are disposed along the direction of propagation of a SAW.

The first IDT electrode 21 includes a pair of comb electrodes 21a and 21b interlocking each other. Similarly, the second IDT electrode 22 includes a pair of comb electrodes 22a and 22b interlocking each other, and the third IDT electrode 23 includes a pair of comb electrodes 23a and 23b interlocking each other.

As illustrated in FIG. 1, the comb electrode 21a of the first IDT electrode 21 and the comb electrode 23a of the third IDT electrode 23 are commonly connected to the antenna terminal through a resonator element 40 defined by a 1-port SAW resonator element. The resonator element 40 and a resonator element 45, which will be described below, define a series trap.

The comb electrode 22a of the second IDT electrode 22 is connected to a ground electrode 52. The comb electrode 22b is connected to the first reception signal terminal 18a.

As illustrated in FIG. 1, the second longitudinally coupled resonator SAW filter section 30 is disposed between the antenna terminal 10 and the second reception signal terminal 18b. As illustrated in FIG. 2, the second longitudinally coupled resonator SAW filter section 30 has a configuration substantially the same as the first longitudinally coupled resonator SAW filter section 20. More specifically, the second longitudinally coupled resonator SAW filter section 30 includes first to third IDT electrodes 31 to 33 arranged in this order along the direction of propagation of a SAW and first and second grating reflectors 34 and 35 disposed on opposite sides of a region where the first to third IDT electrodes 31 to 33 are disposed along the direction of propagation of a SAW. As illustrated in FIG. 1, a comb electrode 31a of the first IDT electrode 31 and a comb electrode 33a of the third IDT electrode 33 are commonly connected to the antenna terminal 10 through the resonator element 45, which is defined by a 1-port SAW resonator element. A comb electrode 32a of the second IDT electrode 32 is connected to a ground electrode 53. A comb electrode 32b of the second IDT electrode 32 is connected to the second reception signal terminal 18b.

The second longitudinally coupled resonator SAW filter section 30 is preferably configured such that the phase of a signal extracted from the first reception signal terminal 18a and the phase of a signal extracted from the second reception signal terminal 18b are different by approximately 180 degrees. More specifically, the first to third IDT electrodes 31 to 33 are configured such that the phase of the first and third IDT electrodes 31 and 33 in the second longitudinally coupled resonator SAW filter section 30 is inverted with respect to the phase of the first and third IDT electrodes 21 and 23 in the first longitudinally coupled resonator SAW filter section 20.

A node of the second IDT electrode 22 in the first longitudinally coupled resonator SAW filter section 20 and the first reception signal terminal 18a and a node of the second IDT electrode 32 in the second longitudinally coupled resonator SAW filter section 30 and the second reception signal terminal 18b are connected to each other through a resonator element 50 composed of a 1-port SAW resonator element. The resonator element 50 defines a parallel trap.

The present preferred embodiment includes a feature that the comb electrode 21b of the first IDT electrode 21 and the comb electrode 23b of the third IDT electrode 23 in the first longitudinally coupled resonator SAW filter section 20 and the comb electrode 31b of the first IDT electrode 31 and the comb electrode 33b of the third IDT electrode 33 in the second longitudinally coupled resonator SAW filter section 30 are connected to a ground electrode 51 through an inductor L4. In other words, the present preferred embodiment includes a feature that the inductor L4 is connected in series between the ground potential and a side opposite to the side at which the first and third IDT electrodes 21, 23, 31, and 33 are connected to the antenna terminal 10.

In the present preferred embodiment, the inductor L4 in the reception filter element 12 can preferably provide a new attenuation range in a region higher than the pass band of the transmission filter element 11 as a transmission characteristic of the transmission filter element 11, as is demonstrated in the Examples described below. Thus, the number of attenuation ranges that the transmission filter element 11 itself needs to form can be reduced. Accordingly, in the transmission filter element 11, the number of parallel arms can be reduced. This enables the transmission filter element 11 to be miniaturized, such that the size of the branching filter 1 can be reduced.

The reason why the inductor L4 in the reception filter element 12 can provide a new attenuation range in the region higher than the pass band of the transmission filter element 11 as a transmission characteristic of the transmission filter element 11 is described below.

Figure 3:
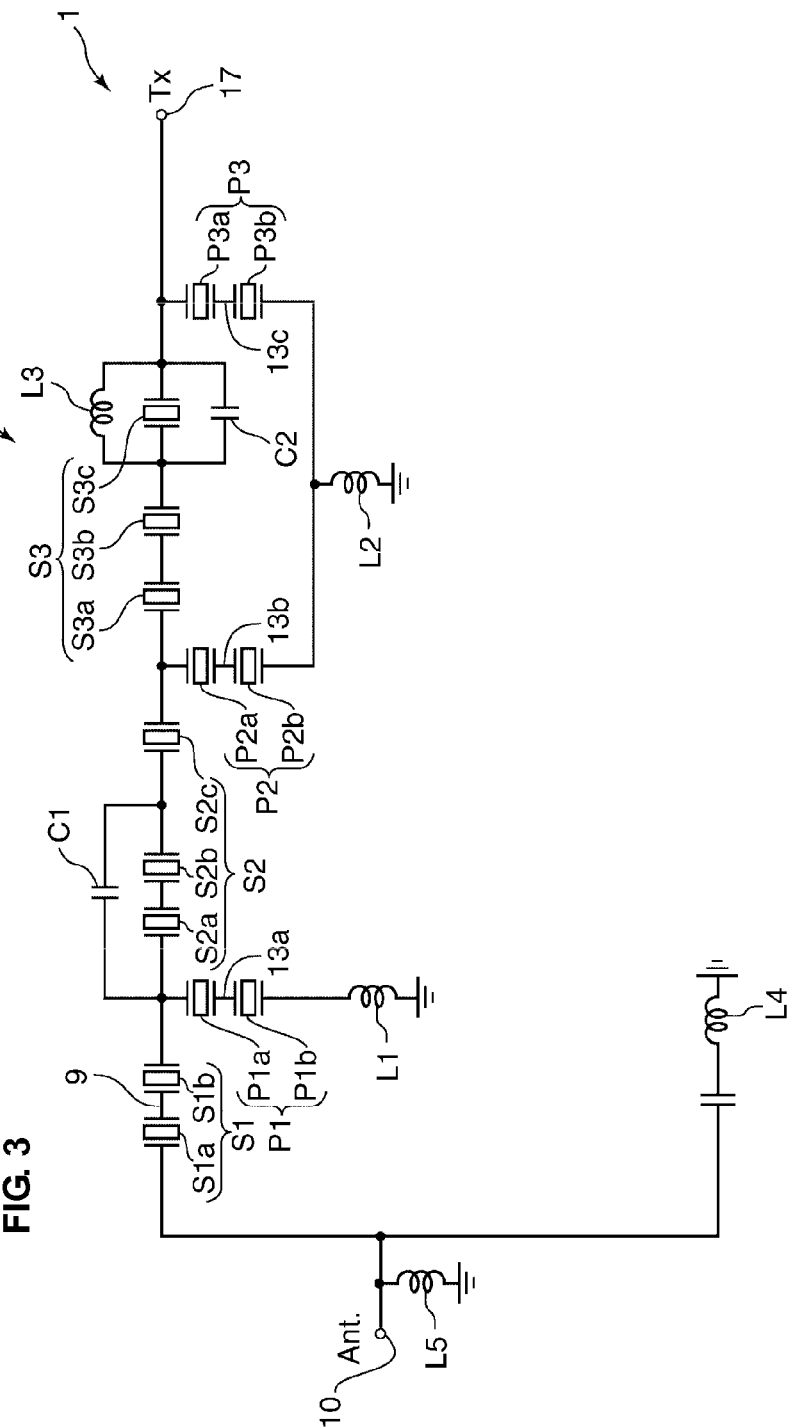
FIG. 3 illustrates a model of the branching filter according to the first preferred embodiment of the present invention in a region higher than a pass band of a transmission filter element.

The resonator elements 40 and 45, which define a series trap, and the IDT electrodes 21, 23, 31, and 33 connected in series to the resonator elements 40 and 45 function as a capacitor in the region higher than the pass band of the transmission filter element 11. Because of this, the branching filter 1 illustrated in FIG. 1 in the region higher than the pass band of the transmission filter element 11 can be modeled into the model illustrated in FIG. 3. That is, in the region higher than the pass band of the transmission filter element 11, the inductor L4 and the capacitive element defined by the resonator elements 40 and 45 and the IDT electrodes 21, 23, 31, and 33 are connected in series between the ground potential and the resonance point between the antenna terminal 10 and the first series arm resonator S1. Accordingly, the inductor L4 enables the reception filter element 12 to be regarded as a parallel arm in the region higher than the pass band of the transmission filter element 11. Thus, the inductor L4 in the reception filter element 12 can provide a new attenuation range in the region higher than the pass band of the transmission filter element 11 as a transmission characteristic of the transmission filter element 11. This reduces the number of parallel arms in the transmission filter element 11, such that the transmission filter element 11, and as a result, the branching filter 1 can be miniaturized.

In the present preferred embodiment, the ground electrode 51, to which the inductor L4 is connected, the ground electrode 52, to which the comb electrode 22a of the second IDT electrode 22 is connected, and the ground electrode 53, to which the comb electrode 32a of the second IDT electrode 32 is connected, are separated, as described above. Accordingly, the insertion loss in an attenuation range produced by the inductor L4 can be further increased. Thus, the filter characteristic of the transmission filter element 11 can be further enhanced.

In the present preferred embodiment, the transmission filter element 11, to which a large electric power is applied, is preferably a ladder filter having high withstand electric power. Accordingly, the withstand electric power of the branching filter 1 can be increased.

Example 1

The branching filter 1 having the structure illustrated in FIGS. 1 and 2 and enabling Rayleigh waves to be excited was produced as described below, and the insertion loss of the transmission filter element 11 occurring when a signal was input from the transmission signal terminal 17 to the antenna terminal 10 was measured.

In the production of the transmission filter element 11, first, a silicon dioxide ($SiO_2$) film having a thickness of approximately 190 nm defining a previous film was formed on a lithium niobate ($LiNbO_3$) substrate having a cut angle of approximately 126.0°. Then, a groove corresponding to the shape of an electrode structure was formed on the previous film. In the groove, a nickel-chromium (NiCr) film (with a thickness of approximately 10 nm), a platinum (Pt) film (with a thickness of approximately 60 nm), a titanium (Ti) film (with a thickness of approximately 10 nm), an aluminum (Al)

film (with a thickness of approximately 90 nm), and a Ti film (with a thickness of approximately 10 nm) were laminated in sequence to form IDT electrodes and grating reflectors. Finally, a SiO$_2$ film having a thickness of approximately 400 nm was formed so as to cover the IDT electrodes and the grating reflectors, and a SiN film having a thickness of approximately 30 nm was formed thereon. In this manner, the transmission filter element 11 was produced.

Each of the resonator elements of the transmission filter element 11 was subjected to cross-width weighting such that the cross width was maximum in a substantially central portion in the direction of propagation of a SAW, was minimum at both sides, and linearly changed therebetween and the minimum cross width at the both sides was approximately 10 percent of the maximum cross width in the substantially central portion.

The design parameters of the resonator elements defining the transmission filter element 11 are shown in Table 1 provided below. In the following, "fingers" indicate electrode fingers.

TABLE 1

| | No. of Fingers of Reflector | Duty Ratio | Cross Width (μm) | Log | Interval λ (μm) |
|---|---|---|---|---|---|
| S1a | 20 | 0.5 | 36 | 170 | 2.0509 |
| S1b | 20 | 0.5 | 36 | 170 | 2.0509 |
| P1a | 20 | 0.5 | 54 | 180 | 2.1683 |
| P1b | 20 | 0.5 | 54 | 180 | 2.1683 |
| S2a | 20 | 0.5 | 48 | 230 | 2.0560 |
| S2b | 20 | 0.5 | 48 | 230 | 2.0560 |
| S2c | 20 | 0.5 | 31 | 140 | 2.0506 |
| P2a | 20 | 0.5 | 52 | 190 | 2.1568 |
| P2b | 20 | 0.5 | 52 | 190 | 2.1568 |
| S3a | 20 | 0.5 | 45 | 150 | 2.0750 |
| S3b | 20 | 0.5 | 45 | 150 | 2.0750 |
| S3c | 20 | 0.5 | 43 | 200 | 2.0559 |
| P3a | 20 | 0.5 | 46 | 150 | 2.1602 |
| P3b | 20 | 0.5 | 46 | 150 | 2.1602 |

The reception filter element 12 was produced by forming an Al film having a thickness of approximately 200 nm on a lithium tantalate (LiTaO$_3$) film having a cut angle of approximately 42.0°.

The design parameters of the resonator elements 40, 45, and 50 of the reception filter element 12 are shown in Table 2 provided below.

TABLE 2

| | No. of Fingers of Reflector | Duty Ratio | Cross Width (μm) | Log | Interval λ (μm) |
|---|---|---|---|---|---|
| IDT electrodes 40, 45 (Series Trap) | 20 | 0.5 | 35 | 62 | 2.100 |
| IDT Electrode 50 (Parallel Trap) | 20 | 0.5 | 17 | 45 | 2.200 |

The design parameters of the first longitudinally coupled resonator SAW filter section 20 of the reception filter element 12 are provided below. A small pitch portion having a smaller interval between electrode fingers than that of the other portions was provided in each of the first IDT electrode 21 and the third IDT electrode 23 at an end adjacent to the second IDT electrode 22. Similarly, such a small pitch portion was provided in the second IDT electrode 22 at an end adjacent to each of the first IDT electrode 21 and the third IDT electrode 23.

The second longitudinally coupled resonator SAW filter section 30 has the same or substantially the same design parameters as in the first longitudinally coupled resonator SAW filter section 20, with the difference being that the phase of a signal output from the second longitudinally coupled resonator SAW filter section 30 is different from the phase of a signal output from the first longitudinally coupled resonator SAW filter section 20 by approximately 180°.

No. of Fingers of 1st Grating Reflector 24: 30
Duty in 1st Grating Reflector 24: approximately 0.63
Interval of Fingers of 1st Grating Reflector 24: approximately 2.190 μm
No. of Fingers in Portion Other Than Small Pitch Portion of 1st IDT Electrode 21: 32
No. of Fingers in Small Pitch Portion of 1st IDT Electrode 21: 5
Duty in Portion Other Than Small Pitch Portion of 1st IDT Electrode 21: approximately 0.68
Duty in Small Pitch Portion of 1st IDT Electrode 21: approximately 0.68
Interval of Fingers in Portion Other Than Small Pitch Portion of 1st IDT Electrode 21: approximately 2.170 μm
Interval of Fingers in Small Pitch Portion of 1st IDT Electrode 21: approximately 2.024 μm
No. of Fingers in Small Pitch Portion of 2nd IDT Electrode 22 Adjacent to 1st IDT Electrode 21: 5
No. of Fingers in Portion Other Than Small Pitch Portions of 2nd IDT Electrode 22: 33
No. of Fingers in Small Pitch Portion of 2nd IDT Electrode 22 Adjacent to 3rd IDT Electrode 23: 5
Duty in Small Pitch Portion of 2nd IDT Electrode 22 Adjacent to 1st IDT Electrode 21: approximately 0.68
Duty in Portion Other Than Small Pitch Portions of 2nd IDT Electrode 22: approximately 0.68
Duty in Small Pitch Portion of 2nd IDT Electrode 22 Adjacent to 3rd IDT Electrode 23: approximately 0.68
Interval of Fingers in Small Pitch Portion of 2nd IDT Electrode 22 Adjacent to 1st IDT Electrode 21: approximately 1.9998 μm
Interval of Fingers in Portion Other Than Small Pitch Portions of 2nd IDT Electrode 22: approximately 2.051 μm
Interval of Fingers in Small Pitch Portion of 2nd IDT Electrode 22 Adjacent to 3rd IDT Electrode 23: approximately 1.9998 μm
No. of Fingers in Small Pitch Portion of 3rd IDT Electrode 23: 5
No. of Fingers in Portion Other Than Small Pitch Portion of 3rd IDT Electrode 23: 32
Duty in Small Pitch Portion of 3rd IDT Electrode 23: approximately 0.68
Duty in Portion Other Than Small Pitch Portion of 3rd IDT Electrode 23: approximately 0.68
Interval of Fingers in Small Pitch Portion of 3rd IDT Electrode 23: approximately 2.024 μm
Interval of Fingers in Portion Other Than Small Pitch Portion of 3rd IDT Electrode 23: approximately 2.170 μm
No. of Fingers of 2nd Grating Reflector 25: 30
Duty in 2nd Grating Reflector 25: approximately 0.63
Interval of Fingers of 2nd Grating Reflector 25: approximately 2.190 μm
Cross Width: approximately 60 μm
Gap between 1st IDT Electrode 21 and Grating Reflector 24 and Gap between 3rd IDT Electrode 23 and Grating Reflector 25: approximately 0.53λ

The other detailed designed parameters are provided below.

| | |
|---|---|
| Capacitor C1: | approximately 1.4 pF |
| Capacitor C2: | approximately 5.5 pF |
| Inductor L1: | approximately 0.6 nH |
| Inductor L2: | approximately 0.8 nH |
| Inductor L3: | approximately 1.15 nH |
| Inductor L4: | approximately 1.25 nH |
| Inductor L5: | approximately 4.5 nH |

Comparative Example

Figure 4:
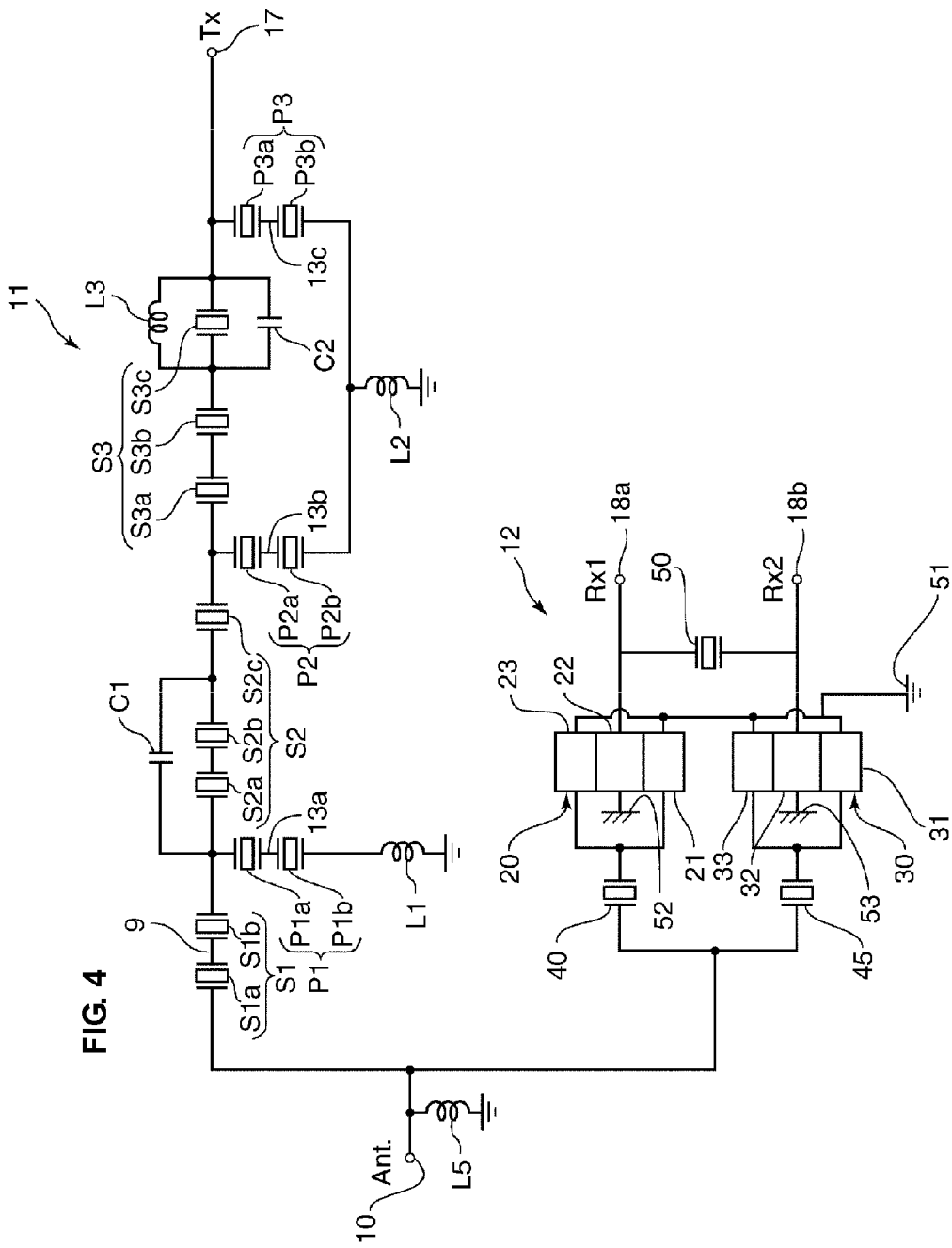
FIG. 4 is a circuit diagram of a branching filter according to a comparative example.

As a comparative example, a branching filter having substantially the same configuration as in the above Example 1, with the difference being that the inductor L4 was not provided, (see FIG. 4), was produced. The insertion loss of the transmission filter element 11 occurring when a signal was input from the transmission signal terminal 17 to the antenna terminal 10 was measured.

Figure 5:
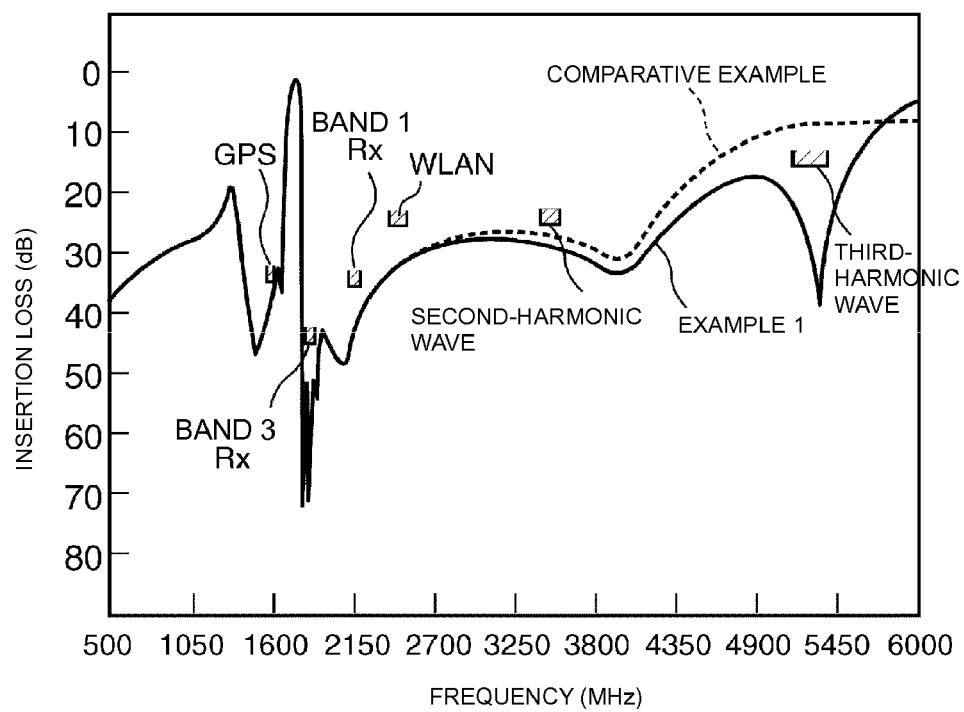
FIG. 5 is a graph that illustrates an insertion loss of the transmission filter element according to each of Example 1 and the comparative example.

Results in Example 1 and the comparative example are illustrated in FIG. 5. As illustrated in FIG. 5, in Example 1, which includes the inductor L4 in the reception filter element 12, an attenuation range was observed in a high frequency band of approximately 5.13 GHz to approximately 5.355 GHz. More specifically, in Example 1, an insertion loss of approximately 21 dB was obtained in a third-harmonic wave band of Band 3.

In contrast, in the comparative example, which does not include an inductor L4 in the reception filter element 12, no attenuation range was observed in the third-harmonic wave band of Band 3. In the comparative example, the insertion loss in the third-harmonic wave band of Band 3 was approximately 7 dB.

The above results illustrate that the inductor L4 in the reception filter element 12 can effectively provide an attenuation range in a region higher than the pass band of the transmission filter element 11.

In Example 1, an attenuation range in a second-harmonic wave band of Band 3 was provided by the first parallel arm resonator P1 and the inductor L1 of the first parallel arm 13a. One possible approach is that an attenuation range in the third-harmonic wave band of Band 3 is provided by the first parallel arm resonator P1 and inductor L1 of the first parallel arm 13a. However, to provide an attenuation range in the third-harmonic wave band of Band 3 using the first parallel arm resonator P1 and the inductor L1 of the first parallel arm 13a, it is necessary for the inductor L1 to have a significantly small inductance. This makes it difficult to produce the inductor L1.

In contrast, as in Example 1, when an attenuation range in the third-harmonic wave band of Band 3 is provided by the inductor L4, the logarithm of each of the IDT electrodes 21, 23, 31, and 33 is relatively small. Accordingly, a significantly small inductance is not required in the inductor L4. Thus, the branching filter 1 can be easily produced.

Further examples of preferred embodiments of the present invention are described below. In the following, the same reference numerals are used for components having functions substantially common to the first preferred embodiment, and the detailed description is not repeated here.

Second Preferred Embodiment

In the first preferred embodiment, an example is described in which the inductor L4, the comb electrode 22a of the second IDT electrode 22, and the comb electrode 32a of the second IDT electrode 32 are connected to different ground electrodes. However, the present invention is not limited to that example. For example, as illustrated in FIG. 6, the inductor L4, the comb electrode 22a of the second IDT electrode 22, and the comb electrode 32a of the second IDT electrode 32 may be connected to the same ground electrode 51.

Even in this case, similar to the above first preferred embodiment, as a transmission characteristic of the transmission filter element 11, a new attenuation range can be provided in a region higher than the pass band of the transmission filter element 11. Accordingly, the number of attenuation ranges that the transmission filter element 11 needs to provide can be reduced. Thus, the number of parallel arms in the transmission filter element 11 can be reduced, such that the transmission filter element 11 can be miniaturized. Thus, the size of the branching filter 1 can be reduced.

Figure 6:
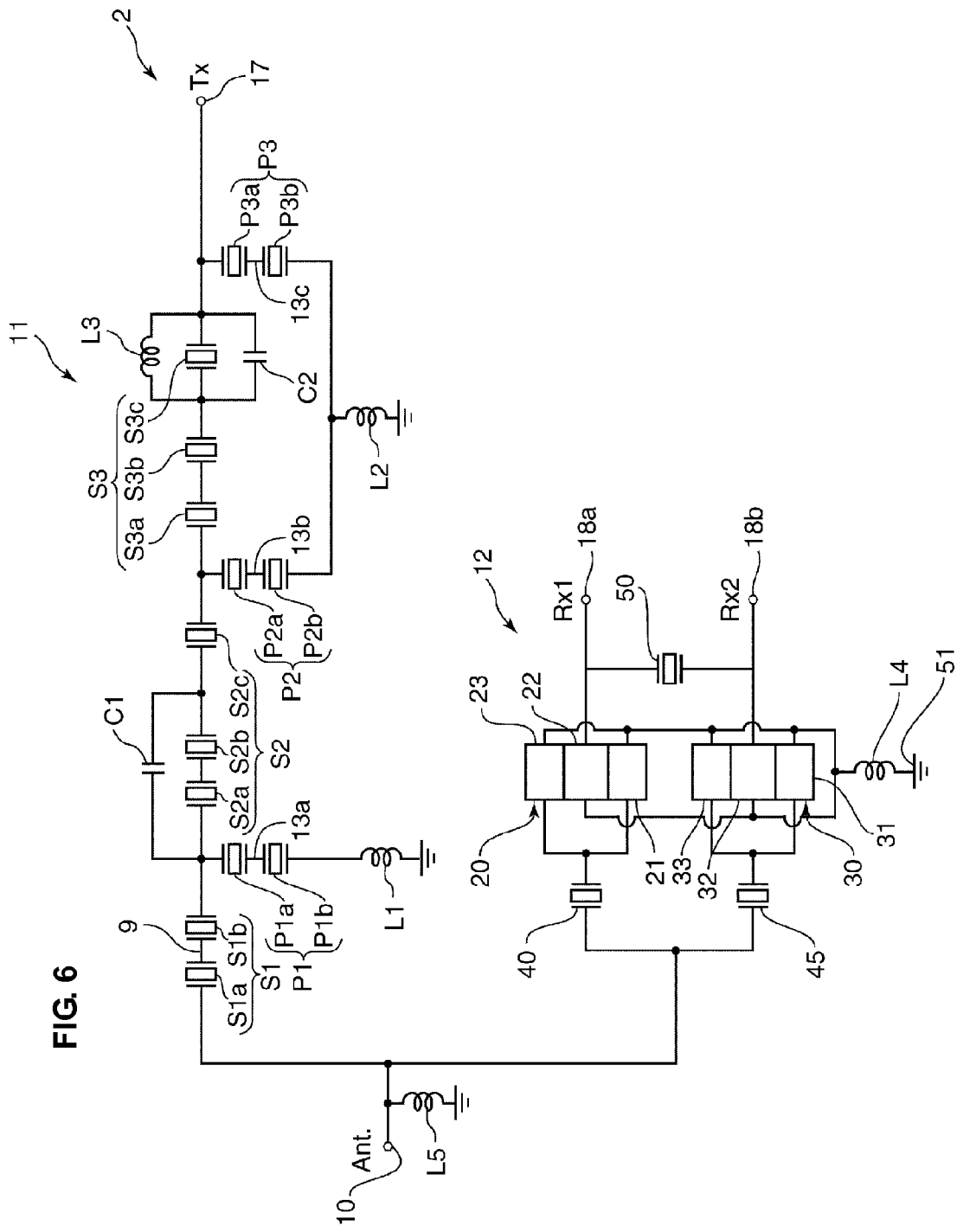
FIG. 6 is a circuit diagram of a branching filter according to a second preferred embodiment of the present invention.
Figure 7:
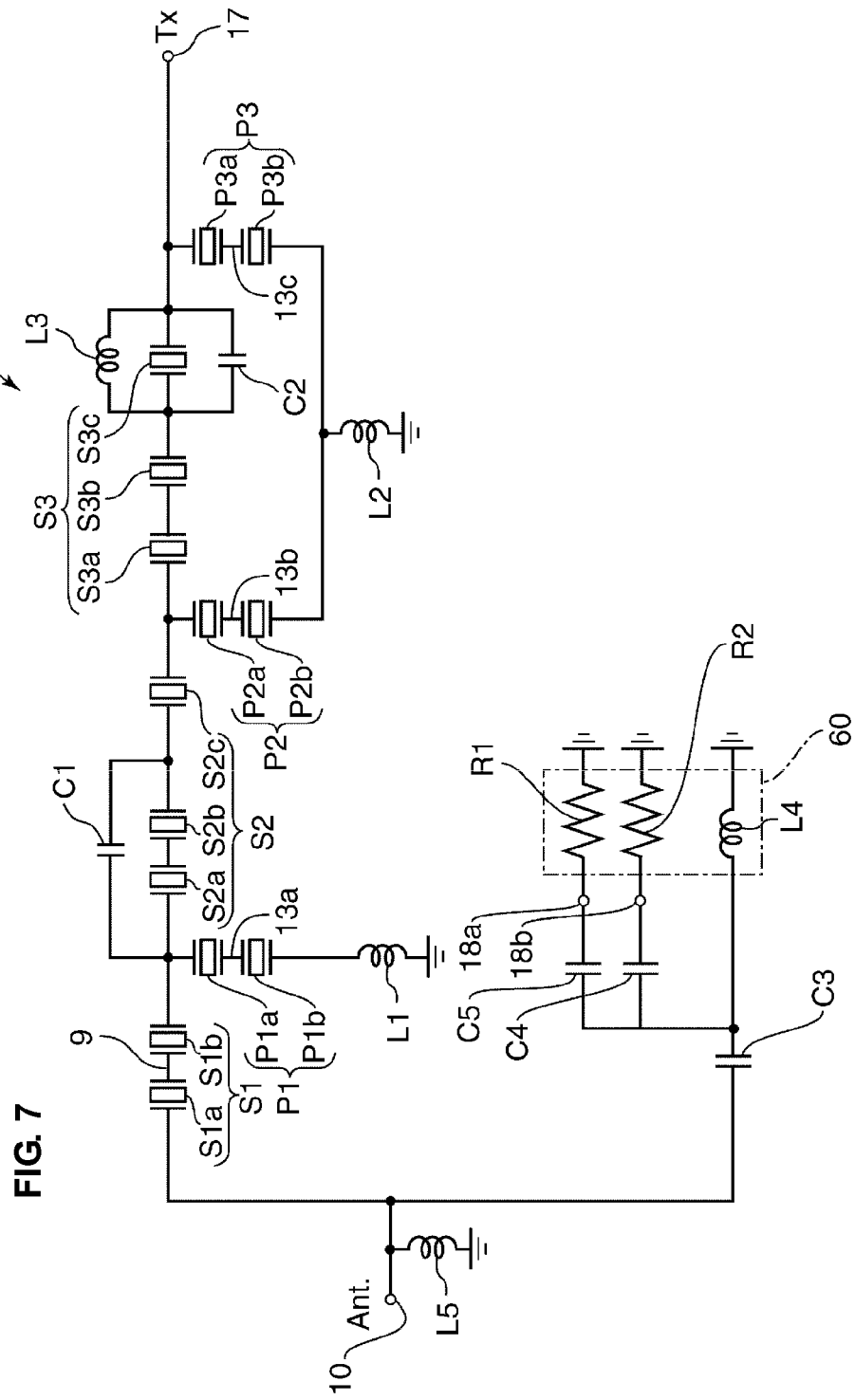
FIG. 7 illustrates a model of the branching filter according to the second preferred embodiment of the present invention.

The branching filter according to the second preferred embodiment illustrated in FIG. 6 can be modeled into the model illustrated in FIG. 7. Characteristic impedances R1 and R2 illustrated in FIG. 7 are IC input impedances connected to the reception signal terminals 18a and 18b, respectively. More specifically, each of the characteristic impedances R1 and R2 according to the present preferred embodiment is a resistor of approximately 50Ω, for example.

As illustrated in FIG. 7, in the present preferred embodiment, in a region higher than the pass band of the transmission filter element 11, the resonator elements 40 and 45 and the IDT electrodes 21, 23, 31, and 33 define a capacitor C3; the second IDT electrode 22 define a capacitor C4; and the second IDT electrode 32 defines a capacitor C5. The inductor L4 and the capacitors C4 and C5 define a parallel resonant circuit 60. The parallel resonant circuit 60 defines an attenuation range in a high frequency band.

In the present preferred embodiment, the characteristic impedances R1 and R2 are connected to the reception signal terminals 18a and 18b, respectively. Accordingly, a Q value of a resonant circuit defined by the parallel resonant circuit 60 and the capacitor C3 is smaller than a Q value of a series resonant circuit including the inductor L4 in the first preferred embodiment.

In the present preferred embodiment, because the capacitors C4 and C5 are connected in parallel to the inductor L4, apparent inductance is large. Thus, the inductance of the inductor L4 can be reduced.

To provide an attenuation range in a third-harmonic wave band of Band 3 by providing the inductor L4, the resonant frequency of that parallel resonator circuit can be set at a frequency higher than the third-harmonic wave band.

Example 2

A branching filter having substantially the same configuration as in Example 1, with the difference being that the inductor L4, the comb electrode 22a of the second IDT electrode 22, and the comb electrode 32a of the second IDT electrode 32 were connected to a common ground electrode and the inductor L4 had an inductance of approximately 0.5 nH, was produced as Example 2. The insertion loss of the transmission filter element 11 occurring when a signal was input from the transmission signal terminal to the antenna terminal 10 was measured.

Figure 8:
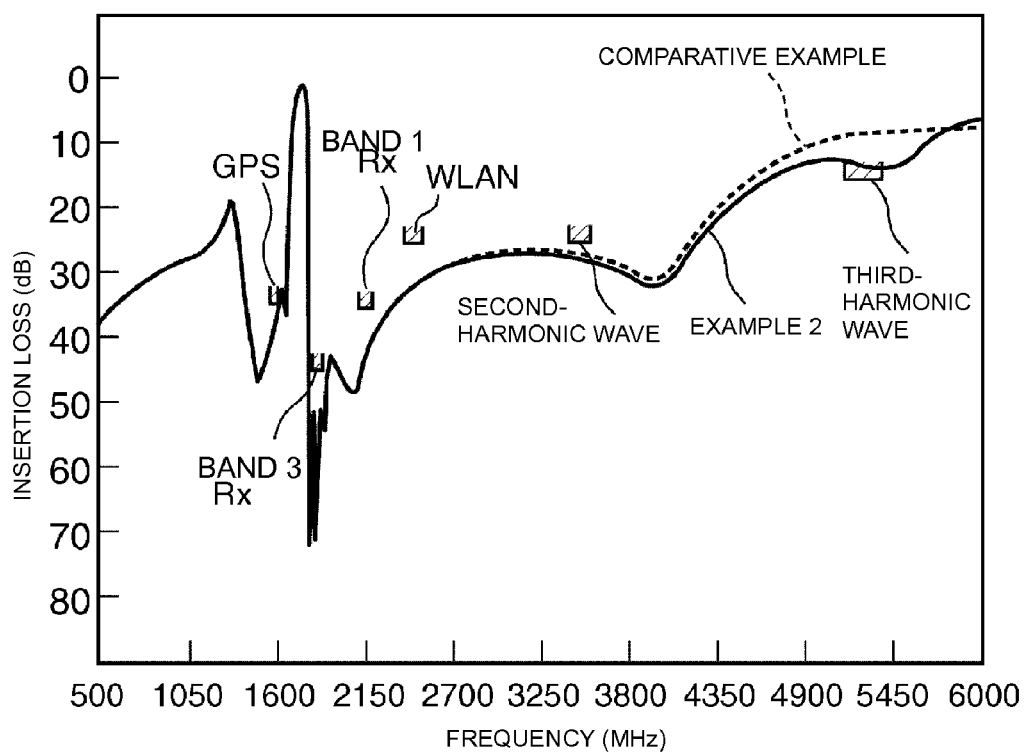
FIG. 8 is a graph that illustrates an insertion loss of the transmission filter element according to each of Example 2 and the comparative example.

Results of Example 2 are illustrated in FIG. 8 together with the results of the comparative example described above. As illustrated in FIG. 8, even when the inductor L4, the comb electrode 22a of the second IDT electrode 22, and the comb electrode 23a of the third IDT electrode 23 were connected to the common ground electrode, an attenuation range was observed in a high frequency band of approximately 5.13 GHz to approximately 5.355 GHz corresponding to the third-harmonic wave band of Band 3. More specifically, in Example 2, an insertion loss of approximately 13 dB, which was greater than the insertion loss in the comparative example (approximately 7 dB) by approximately 6 dB, was obtained.

The results of Examples 1 and 2 and the comparative example illustrate that, irrespective of whether the inductor L4, the comb electrode 22*a* of the second IDT electrode 22, and the comb electrode 32*a* of the second IDT electrode 32 are connected to the same or different ground electrodes, the inductor L4 in the reception filter element 12 enables an attenuation range to be provided in a region higher than the pass band of the transmission filter element 11.

It is noted that the insertion loss (approximately 21 dB) in the third-harmonic wave band of Band 3 in Example 1, in which the inductor L4, the comb electrode 22*a* of the second IDT electrode 22, and the comb electrode 32*a* of the second IDT electrode 32 are connected to different ground electrodes is greater than the insertion loss (approximately 13 dB) in the third-harmonic wave band of Band 3 in Example 2, in which the inductor L4, the comb electrode 22*a* of the second IDT electrode 22, and the comb electrode 32*a* of the second IDT electrode 32 are connected to the common ground electrode. This result illustrates that connecting the inductor L4, the comb electrode 22*a* of the second IDT electrode 22, and the comb electrode 32*a* of the second IDT electrode 32 to different ground electrodes can further increase the insertion loss in the attenuation range in the third-harmonic wave band of Band 3.

In the first and second preferred embodiments, an example is described in which only the reception filter element includes a longitudinally coupled resonator filter element. However, the present invention is not limited to this example. For example, both the transmission filter element and the reception filter element can include a longitudinally coupled resonator filter element.

In the above-described preferred embodiments, an example is described in which the longitudinally coupled resonator filter element utilizes a SAW. However, in the present invention, the longitudinally coupled resonator filter element can utilize a boundary elastic wave.

While preferred embodiments of the invention have been described above, it is to be understood that variations and modifications will be apparent to those skilled in the art without departing from the scope and spirit of the present invention. The scope of the present invention, therefore, is to be determined solely by the following claims.

What is claimed is:

1. A branching filter comprising:
   an antenna terminal;
   a transmission signal terminal;
   a reception signal terminal;
   a transmission filter element disposed between the antenna terminal and the transmission signal terminal; and
   a reception filter element disposed between the antenna terminal and the reception signal terminal; wherein
   at least one of the transmission filter element and the reception filter element includes a longitudinally coupled resonator filter element including first and second IDT electrodes arranged along a direction of propagation of an elastic wave, the first IDT electrode having a first end connected to the antenna terminal, the second IDT electrode having a first end connected to one of the transmission signal terminal and the reception signal terminal;
   the longitudinally coupled resonator filter element further includes an inductor connected in series between a second end of the first IDT electrode and a ground potential and arranged to provide an attenuation range in a region higher than a pass band of the at least one of the transmission filter element and the reception filter element; and
   the reception filter element includes the longitudinally coupled resonator filter element, and the transmission filter element includes a ladder filter element.

2. The branching filter according to claim 1, wherein the inductor is connected to a first ground electrode, and the second IDT electrode includes a second end connected to a second ground electrode separated from the first ground electrode.

* * * * *